United States Patent
White et al.

(10) Patent No.: US 11,149,235 B2
(45) Date of Patent: Oct. 19, 2021

(54) CLEANING COMPOSITION WITH CORROSION INHIBITOR

(71) Applicant: ENTEGRIS, INC., Billerica, MA (US)

(72) Inventors: Daniela White, Ridgefield, CT (US); Elizabeth Thomas, New Milford, CT (US); Jun Liu, Newtown, CT (US); Michael White, Ridgefield, CT (US); Chao-Yu Wang, Zhubei (TW); Donald Frye, Sherman, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 16/515,935

(22) Filed: Jul. 18, 2019

(65) Prior Publication Data

US 2020/0024554 A1 Jan. 23, 2020

Related U.S. Application Data

(60) Provisional application No. 62/701,198, filed on Jul. 20, 2018.

(51) Int. Cl.

| | | |
|---|---|---|
| *C11D 7/32* | (2006.01) | |
| *C11D 11/00* | (2006.01) | |
| *C11D 7/50* | (2006.01) | |
| *H01L 21/02* | (2006.01) | |
| *C11D 7/34* | (2006.01) | |

(52) U.S. Cl.
CPC ........ *C11D 11/0047* (2013.01); *C11D 7/329* (2013.01); *C11D 7/3245* (2013.01); *C11D 7/3272* (2013.01); *C11D 7/3281* (2013.01); *C11D 7/34* (2013.01); *C11D 7/5022* (2013.01); *H01L 21/02074* (2013.01)

(58) Field of Classification Search
CPC .................................................. C11D 11/0047
USPC ........................................................ 510/175
See application file for complete search history.

(56) References Cited

U.S. PATENT DOCUMENTS

| | | |
|---|---|---|
| 6,344,157 B1 | 2/2002 | Cheng et al. |
| 7,273,060 B2 | 9/2007 | Patel |
| 8,003,587 B2 | 8/2011 | Lee |

(Continued)

FOREIGN PATENT DOCUMENTS

| | | |
|---|---|---|
| CN | 1526008 A | 9/2004 |
| CN | 1555563 A | 12/2004 |

(Continued)

OTHER PUBLICATIONS

Chernin, CN, et al.; "Aqueous alkaline-solutions for cleaning surfaces—sodium-hydroxide and monoethanolamine solutions"; Colloid Journal of the Russian Academy of Sciences; vol. 54/5, pp. 789-792, 1992; Abstract Only.

(Continued)

*Primary Examiner* — Gregory E Webb

(57) ABSTRACT

A cleaning composition and process for cleaning an in-process microelectronic device substrate, e.g., by post-chemical mechanical polishing (CMP) cleaning, to remove residue from a surface thereof, wherein the cleaning composition may be especially effective for cleaning a substrate surface that includes exposed metal such as cobalt, copper, or both, along with dielectric or low k dielectric material, and wherein the cleaning composition includes corrosion inhibitor to inhibit corrosion of the exposed metal.

19 Claims, 2 Drawing Sheets

(56) References Cited

U.S. PATENT DOCUMENTS

| | | | |
|---|---|---|---|
| 8,148,310 B2 | 4/2012 | Lee | |
| 8,361,237 B2 | 1/2013 | Wu | |
| 8,647,445 B1 | 2/2014 | Chhabra | |
| 2005/0197265 A1* | 9/2005 | Rath | G03F 7/425 510/175 |
| 2006/0154838 A1* | 7/2006 | Hayashida | H01L 21/02052 510/175 |
| 2007/0060490 A1* | 3/2007 | Skee | C11D 11/0047 510/175 |
| 2009/0118153 A1* | 5/2009 | Rath | C11D 7/3209 510/176 |
| 2009/0120457 A1 | 5/2009 | Naghshineh | |
| 2013/0296214 A1* | 11/2013 | Barnes | H01L 21/02063 510/176 |
| 2014/0100151 A1 | 4/2014 | Egbe | |
| 2016/0083675 A1* | 3/2016 | Morita | C11D 7/3209 438/687 |
| 2016/0130500 A1 | 5/2016 | Chen | |
| 2016/0152926 A1 | 6/2016 | Minsek et al. | |
| 2016/0340620 A1 | 11/2016 | Sun | |
| 2018/0272386 A1* | 9/2018 | McAlpin | C11D 3/1213 |

FOREIGN PATENT DOCUMENTS

| | | |
|---|---|---|
| CN | 1670147 A | 9/2005 |
| CN | 1739064 A | 2/2006 |
| CN | 1904016 A | 1/2007 |
| CN | 101164016 A | 4/2008 |
| CN | 101187787 A | 5/2008 |
| CN | 101681129 A | 3/2010 |
| CN | 101389707 B | 12/2010 |
| CN | 102004399 A | 4/2011 |
| CN | 102227687 A | 10/2011 |
| CN | 102449196 A | 5/2012 |
| CN | 102827707 A | 12/2012 |
| CN | 102827708 A | 12/2012 |
| CN | 104395989 A | 3/2015 |
| CN | 106222677 A | 12/2016 |
| GB | 1083049 A | 9/1967 |
| JP | 2001339142 A | 12/2001 |
| TW | 200628638 A | 8/2006 |
| WO | 2014149741 A1 | 9/2014 |
| WO | 2016011331 A1 | 1/2016 |

OTHER PUBLICATIONS

Lavoue, J et al.; "Technical, occupational health and environmental aspects of metal degreasing with aqueous cleaners"; Annals of Occupational Hygiene; Vo. 47, Issue 6, pp. 441-459, Aug. 2003.

* cited by examiner

CLEANING COMPOSITION WITH CORROSION INHIBITOR

FIELD OF THE INVENTION

The following description relates to liquid compositions for cleaning a surface of a microelectronic device substrate, such as for cleaning residue from a surface of a microelectronic device substrate, wherein the liquid compositions contain a corrosion inhibitor.

BACKGROUND

Microelectronic device substrates are used for preparing integrated circuit devices. The microelectronic device substrate includes a base, such as a silicon wafer having a highly planar surface. Onto the planar surface of the base, by way of many multiples of selective placement and removal steps, regions of electronically-functional features are added. The features are made by selectively adding and removing electronically-functional materials that exhibit insulative, conductive, or semi-conductive properties. These electronically-functional materials are placed as desired by use of processing materials that include photoresist, chemical etchant, and slurries that contain abrasive particles and chemical materials that aid in processing the surface.

One feature of integrated circuits is an array of conductive "interconnects," which are also referred to as "lines" and "vias." As part of an integrated circuit, conductive interconnects function to conduct electric current among and between various other electronic features. Each interconnect is in the form of a line or thin film of conductive material that extends within and is defined (in shape and size) by openings formed in an insulative material, i.e., a dielectric material such as a low k dielectric material. The dielectric material acts as an insulator between the very-closely spaced interconnect structures, and between the interconnect structures and other electronic features of the integrated circuit.

The types of materials used to produce the interconnect and the low k dielectric structures must be selected to properly function as part of an integrated circuit that performs at high efficiency and high reliability. For example, the conductive material of an interconnect should be of a type that does not migrate (e.g., diffuse) excessively into an adjacent dielectric material over time and during use in the presence of a voltage between the materials; such migration of interconnect material into an adjacent dielectric material is often referred to as "electromigration." At the same time, the combined interconnect and dielectric material structure must have sufficient integrity, including at an interface between these materials, to result in a low level of defects and a high level of performance reliability. For example, a strong bond must exist at the interface to prevent separation of the low k dielectric material from the interconnect material during use.

Interconnects have in the past been commonly made of aluminum or tungsten, and more recently are made of copper. Copper has an advantageously high conductivity relative to aluminum and tungsten. In addition, copper-based interconnects offer better resistance to electromigration as compared to aluminum, thereby improving the reliability of the integrated circuit over time. Still, copper ions can tend to diffuse into silicon dioxide ($SiO_2$) under sufficient electrical bias, and adhesion of copper to silicon dioxide and to other dielectric materials can be poor.

To prevent these negative interactions of copper with a dielectric material, recent integrated circuit structures have been designed to include a barrier layer between a copper interconnect structure and an adjacent dielectric material. Example barrier layers may be conductive materials or non-conductive materials, examples including tantalum (Ta), tantalum nitride ($TaN_x$), tungsten (W), titanium (Ti), titanium nitride (TiN), ruthenium (Ru), cobalt (Co), molybdenum (Mo), rhenium (Rh), and alloys thereof.

Processes of placing the various features of microelectronic devices onto a substrate include selectively placing insulative materials (e.g., dielectric, low k dielectric, etc.), semiconducting materials, metal materials (e.g., conductive lines and vias (i.e., interconnects), etc., onto a substrate surface. Selective placement and removal of these materials may involve the use of process compositions such as photoresist, etchant, CMP slurries that contain abrasive and chemical materials, and plasma, among others, in steps such as photoresist coating, etching (e.g., wet etching, plasma etching), chemical-mechanical processing (a.k.a., chemical-mechanical polishing, chemical-mechanical planarization, or simply "CMP"), and ashing ("plasma ashing").

Chemical-mechanical processing is a process by which very small amounts (thicknesses) of material are precisely removed from a surface of a microelectronic device substrate to polish (or "planarize") the surface in preparation for a subsequent layer of material to be applied onto the processed surface. Chemical-mechanical processing involves highly precise mechanical abrasion of a surface, coupled with controlled interactions of chemical materials, such as oxidation, reduction, or chelation of a material that is present at or removed from the surface. Often, one type of material at the substrate surface (e.g., metal overburden) is preferentially removed, with high selectively, in comparison to a reduced degree of removal of one or more other materials that are also present at the surface (e.g., dielectric material).

A CMP process involves applying a "slurry" to the surface along with contacting the surface with a moving CMP pad. The "slurry" is a liquid composition that contains microabrasive particles that provide mechanical abrasion of the surface, along with chemical materials that interact chemically with materials of the surface to facilitate selective removal of certain material from the surface and, often, to inhibit removal of another surface material. The slurry is applied to the surface while the CMP pad contacts the surface with the desired amount of pressure and motion to facilitate the abrasive and chemical removal of select materials from the surface. The combination of the mechanical action of the pad and abrasive particles moving against the surface, along with the action of the chemical ingredients, achieves desired removal, planarization, and polishing of the surface with desired low levels of defects and residue. The CMP process should produce a highly planar, low-defect, low-residue surface to which a subsequent layer of a microelectronic device can be applied.

After a processing step (e.g., chemical-mechanic processing, etching, ashing, etc.), at least some amount of residue will be present at a surface of a substrate. Residue may include abrasive particles from a CMP slurry or other processing material; active chemical ingredients that are part of a CMP slurry (e.g., oxidizer, catalyst, inhibitor) or other processing composition (e.g., etchant); a reaction product or by-product of a processing material or ingredient thereof; a chemical etchant; photoresist polymer or other solid processing ingredient; etc. Any such residue must be removed by cleaning the surface before performing a subsequent step of a microelectronic device fabrication process, to avoid defects or other potential sources of reduced device performance or reliability.

Certain methods and equipment commonly used for cleaning a surface of a microelectronic substrate, e.g., after an etching step, after a CMP step, or after another step used in fabricating a multi-layer microelectronic device, include those that involve a flow of cleaning solution over the surface in combination with megasonics, jetting, or brushing to remove residue and contaminants. Typical cleaning solutions are alkaline solutions, e.g., containing a suitable hydroxide compound along with other chemical materials that together remove residue from the surface by chemically interacting with the residue. The cleaning solution should be effective to remove a high percentage of residue from a surface, but also must be safe with respect to functional features of the substrate. A cleaning solution must not cause damage to those features. For example, a cleaning solution should not cause corrosion (i.e., oxidation) of a metal feature of a substrate, e.g., should not oxidize copper or cobalt metal features of a substrate that may be present as interconnect or barrier features.

Many varieties of high pH cleaning compositions for microelectronic device processing contain ingredients such as a basic compound, cleaning compounds, chelating agents, surfactant, oxidizer, corrosion inhibitor, etc., among others. New, useful, and improved cleaning compositions and specific ingredients are continually sought, especially for use with new microelectronic device structures such as those that may now include copper or cobalt as interconnect or barrier structures. A variety of basic compounds are known and useful for alkaline cleaning solutions, one example being tetramethylammonium hydroxide (TMAH). But because this compound is known to be a dermal toxin, the semiconductor fabrication industry in interested in alternative basic compounds for use in cleaning solutions. At the same time, new and useful cleaning compositions with good cleaning performance and preferably with low corrosive effects on exposed metals are needed for processing new microelectronic device substrates, such as substrates that include copper, cobalt, or both, at a surface.

SUMMARY

There is an ongoing need to provide compositions and methods that are useful for removing residue from a surface of an in-process microelectronic device substrate. The present invention relates to such compositions, referred to herein as "cleaning compositions, e.g., "cleaning solutions." Preferred compositions provide effective or highly effective cleaning and removal of residue from the surface while inhibiting damage (e.g., corrosion) to metal features of the surface.

According to the invention, useful cleaning compositions include an aqueous carrier (i.e., water) along with a combination of non-aqueous ingredients that include: base (to provide an alkaline pH), cleaning compound, and corrosion inhibitor. Described compositions may also optionally contain any one or more of various additional non-aqueous ingredients that may be useful for removing residue from a substrate surface, for example any one or more of: chelating agent, oxidizer, surfactant, buffer, biocide, organic solvent (e.g., low molecular weight alcohols, polyols), or any other minor ingredient that may be useful in a cleaning composition as described. A preferred cleaning composition, before being used in a cleaning process, is a homogeneous solution that has all of its non-aqueous ingredients substantially dissolved in the water, as a solution, and does not contain any suspended solid materials such as solid abrasive particles.

The Applicant has discovered that various compounds that have not previously been known to be effective to inhibit corrosion of a metal, when used in a cleaning composition for cleaning a surface of a microelectronic device substrate, are in fact effective or advantageous, in a novel and inventive manner, for use as corrosion inhibitors in these cleaning compositions and methods. Generally, useful corrosion inhibitors of the invention include guanidine functional additives, pyrazolone functional additives, and 8-hydroxyquinoline and related compounds. Certain more specific example compounds that Applicant has identified as novel and inventive corrosion inhibitors in a cleaning composition include: 2-methyl-3-butyn-2-ol, 3-methyl-2-pyrazolin-5-one, 8-hydroxyquinoline, and dicyandiamide, any of which can be used alone (i.e., separately) or in combination in a cleaning composition.

In certain embodiments, these corrosion inhibitors can be used in novel and inventive cleaning compositions that are not based on the presence of tetramethylammonium hydroxide (TMAH) as a base. TMAH is a common and effective base used in cleaning compositions for the semiconductor fabrication industry, but is currently disfavored due to its toxicity. Other bases are known and available, but are not always able to match the performance of TMAH in terms of cleaning efficacy and prevention of damage (e.g., corrosion) to metal (e.g., copper) features of the substrate surface. Accordingly, new cleaning solutions that do not require or contain TMAH, and that are able to provide cleaning efficacy and reduced corrosion performance that are comparable to or better than TMAH-containing cleaning solutions, are particularly desired.

Thus, the present description relates to cleaning compositions for cleaning in-process microelectronic device substrates, the compositions including water, base (basic compound), cleaning compound, and corrosion inhibitor that is selected from: 2-methyl-3-butyn-2-ol, 3-methyl-2-pyrazolin-5-one, dicyandiamide, 8-hydroxyquinoline, or a combination of two or more of these. Any one or combination of these corrosion inhibitors can be used or useful with a variety of basic compounds, but can be particularly desired for use in a cleaning composition that does not contain TMAH as a base; alternate basic compounds useful for certain example cleaning compositions include choline hydroxide, tetraethylammonium hydroxide, or a combination of these.

The described cleaning compositions can include any of various known cleaning compounds, with particular examples including alkanol amine as a cleaning compound. The alkanol amine can be any alkanol amine that will be effective as a cleaning compound, including any primary, secondary, or tertiary amine. The alkanol amine will have at least one alkanol substituent (e.g., methanol, ethanol, etc.), and one, two, or three alkanol, alkyl, or alternate organic substituents. Certain useful alkanol amines are primary alkanol amines such as monoethanolamine (MEA). The cleaning composition may optionally contain an additional cleaning compound (i.e., "secondary" cleaning compound) such as morpholine, L-cysteine, hydroxyl ethyl cellulose, a polyamine, a glycol ether, among others.

The described cleaning compositions can include any of various guanidine functional additives such as dicyandiamide, guanylurea, salts, guanidine salts, glycocyamine, and various pyrazolone functional additives such as 2-methyl-3-butyn-2-ol, 3-methyl-2-pyrazolin-5-one such as 3-methyl- 1-4sulfophenyl)-2-pyrazolin-5-one or 3-methyl-1-p-tolyl-5-pyrazolone, and 8-hydroxyquinoline and related compounds, (8-hydroxyquinoline-2-carboxylic acid, 5-chloro7-iodo-quinolin-8-ol, 5,7-dichloro-2-[(dimethylamino)methyl]quinolin-8-ol, 8-hydroxyquinoline-4-carbaldehyde, 8-hydroxyquinoline-4-carbaldehyde-oxime, 8-hydroxyquinoline-5-sulfonic acid monohydrate) or a combination of two or more of these, as a corrosion inhibitor. Optionally, the composition can contain one or more additional corrosion inhibitors (i.e., one or more "secondary" corrosion inhibitors), for example, a secondary corrosion inhibitor selected from oxalic acid, succinic acid, L-tartaric acid, and combinations of these, among others.

According to preferred cleaning compositions and methods, certain cleaning compositions that contain corrosion inhibitor selected from dicyandiamide, 2-methyl-3-butyn-2-ol, 3-methyl-2-pyrazolin-5-one, 8-hydroxyquinoline or a combination of two or more of these, can exhibit useful or advantageous cleaning performance as described herein in combination with improved performance in terms of reduced corrosion of metal (e.g., copper, cobalt, or both). Certain examples of such cleaning compositions can also contain: choline hydroxide, tetraethylammonium hydroxide (TEAH), or both, as a basic compound; alkanol amine (e.g., MEA) as a cleaning compound. During a cleaning process using such a preferred composition, for cleaning a substrate that contains an exposed copper feature (e.g., interconnect), cobalt feature (e.g., barrier layer), or both, the amount of corrosion of the copper, the cobalt, or both, that occurs during cleaning can be reduced as compared to an amount of corrosion that would occur using the same substrate and process, with a cleaning composition that is otherwise identical but that does not contain the various guanidine functional additives such as dicyandiamide, guanylurea, salts, guanidine salts, glycocyamine and various pyrazolone functional additives such as 2-methyl-3-butyn-2-ol, 3-methyl-2-pyrazolin-5-one such as 3-methyl-1-4sulfophenyl)-2-pyrazolin-5-one or 3-methyl-1-p-tolyl-5-pyrazolone, and 8-hydroxyquinoline and related compounds (8-hydroxyquinoline-2-carboxylic acid, 5-chloro7-iodo-quinolin-8-ol, 5,7-dichloro-2-[(dimethylamino)methyl]quinolin-8-ol, 8-hydroxyquinoline-4-carbaldehyde, 8-hydroxyquinoline-4-carbaldehyde-oxime, 8-hydroxyquinoline-5-sulfonic acid monohydrate), or a combination of two or more of these.

Additionally or alternatively, such preferred cleaning compositions as described, also used in an identical process for cleaning the same substrate, can produce useful cleaning results with a relatively lower amount of corrosion of copper, cobalt, or both, when compared to other known cleaning compositions that are based on the use of TMAH as a base; the amount of corrosion of copper, cobalt, or both, that occurs with an inventive cleaning composition and process may be the same as compared to the use of a TMAH-based cleaning composition in the same process, or, preferably, may be reduced by at least 10, 20, 30, or 40 percent (e.g., as measured as static etch rate) as compared to the same process with a TMAH-based cleaning composition. An amount of corrosion caused by a cleaning composition can be measured by known, and commercially available equipment and methods, including by performing known tests such as testing of a metal etching rate, e.g., static etch rate.

In particular embodiments, example cleaning compositions contain water and non-aqueous ingredients that comprise, consist of, or consist essentially of: base (e.g., consisting of or consisting essentially of choline hydroxide, TEAH, TMAH, a quaternary ammonium compound, potassium hydroxide, or a combination of these), cleaning compound as described, such as alkanol amine (e.g., consisting if or consisting essentially of MEA); and corrosion inhibitor (e.g., as described, for example consisting of or consisting essentially of one or more of: various guanidine functional additives such as dicyandiamide, guanylurea, salts, guanidine salts, glycocyamine; various pyrazolone functional additives such as 2-methyl-3-butyn-2-ol, 3-methyl-2-pyrazolin-5-one such as 3-methyl-1-4sulfophenyl)-2-pyrazolin-5-one or 3-methyl-1-p-tolyl-5-pyrazolone; and 8-hydroxyquinoline and related compounds (8-hydroxyquinoline-2-carboxylic acid, 5-chloro7-iodo-quinolin-8-ol, 5,7-dichloro-2-[(dimethylamino)methyl]quinolin-8-ol, 8-hydroxyquinoline-4-carbaldehyde, 8-hydroxyquinoline-4-carbaldehyde-oxime, 8-hydroxyquinoline-5-sulfonic acid monohydrate) and each may be used separately, in combinations with each other, or in combination with one or more additional (e.g., "secondary") corrosion inhibitors).

As used herein, unless otherwise specified, a composition or ingredient of a composition that is described as "consisting essentially of" one or more specified items refers to a composition or ingredient that is made up of only those specified items with not more than an insubstantial amount of other (additional) materials, e.g., contains only the specified items and not more than 5, 3, 2, 1, 0.5, 0.1, 0.05, or 0.01 weight percent additional ingredients based on the total weight of the composition or the ingredient. As used herein, a composition or ingredient of a composition that is described as "consisting of" one or more specified items refers to a composition or ingredient that is made up of only those specified items.

In addition, the composition may optionally include organic solvents, chelators, complexants, polymers, surfactants or other components typical of a cleaning formulation.

As used herein, the term "residue" (which is inclusive of a "contaminant") refers to any material that is a chemical or particulate material that remains present at a surface of a microelectronic device substrate after a processing step used in the fabrication of a microelectronic device, example processing steps including plasma etching, plasma ashing (to remove photoresist from an etched wafer), chemical-mechanical processing, wet etching, etc. The residue may be any non-aqueous chemical material that is part of a processing composition used in the processing step, such as a chemical etchant, a photoresist, a CMP slurry, etc. The residue may alternately be a substance that is derived from a material of the processing composition during a processing step. Examples of these types of residues include non-aqueous, particulate or non-particulate, chemical or abrasive materials (e.g., abrasive particles, surfactant, oxidizer, corrosion inhibitor, catalyst) that remain at a surface of the substrate after processing. The residue may be originally present in a material such as a CMP slurry or an etching composition, such as a solid abrasive particle or chemical material present in a CMP abrasive slurry. Alternately, a residue may be a by-product or a reaction product (in particulate (e.g., agglomerate, precipitate) or non-particulate form) that is generated during processing, e.g., a by-product or reaction product of a chemical present in a processing composition such as CMP slurry or wet etching composition, or a chemical that is present, used during, or produced during a plasma etching or a plasma ashing process.

The term "post-CMP residue" refers to residue that is present at an end of a CMP processing step, for example a particle or chemical material that is present in or derived from a CMP slurry; specific examples include abrasive particles (e.g., silica-containing or silica-based abrasive particles, metal oxide (e.g., alumina) particles, ceria or ceria-based particles and the like); chemicals that are originally present in the slurry such as an oxidizer, catalyst, surfactant, inhibitor, chelating agent, etc.; a metal (e.g., ion), metal oxide, or metal complex that is derived from a metal material removed from the substrate surface being processed; or a reaction product or complex produced using a chemical of the slurry with another chemical of the slurry or with a chemical material derived from the substrate, such as a metal ion; pad particles; or any other material that is a product of the CMP process.

A "post-etch residue" refers to a material remaining following a gas-phase plasma etching process, e.g., back-end-of-line ("BEOL") dual damascene processing, or wet etching processes. A post-etch residue may be organic, organometallic, organosilicic, or inorganic in nature, for example, silicon-containing material, carbon-based organic material, and etch gas residues such as oxygen and fluorine.

A "post-ash residue" refers to material remaining following oxidative or reductive plasma ashing to remove hardened photoresist and/or bottom anti-reflective coating (BARC) materials. The post-ash residue may be organic, organometallic, organosilicic, or inorganic in nature.

As used herein a "low-k dielectric material" is a material used as a dielectric material in a multi-layer microelectronic device, wherein the material has a dielectric constant less than about 3.5. Example low-k dielectric materials include low-polarity materials such as silicon-containing organic polymers, silicon-containing hybrid organic-inorganic materials, organosilicate glass (OSG), TEOS, fluorinated silicate glass (FSG), and carbon-doped oxide (CDO) glass. A low-k dielectric materials may have a density and a porosity from among a range of useful densities and from a range of useful porosities.

In one aspect, the invention relates to a cleaning composition for cleaning a microelectronic device substrate. The cleaning composition includes: water; base to provide a pH of at least 8; cleaning compound; and corrosion inhibitor selected from: a guanidine functional compound, a pyrazolone functional compound, and a hydroxyquinoline compound.

In another aspect, the invention relates to a method of cleaning a microelectronic device substrate. The method includes: providing cleaning composition as described; providing a microelectronic device substrate; and contacting a surface of the microelectronic device substrate with the cleaning composition.

DETAILED DESCRIPTION

Figure 1:
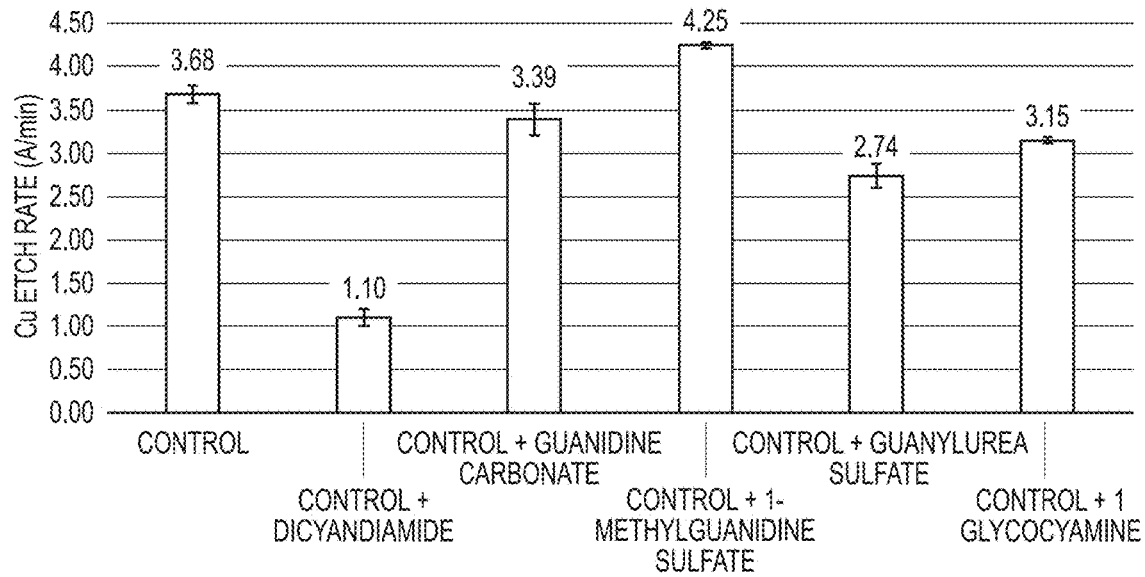
FIGS. 1 through 3 show etch rate test data for cleaning compositions as described, relative to non-inventive cleaning compositions.
Figure 2:
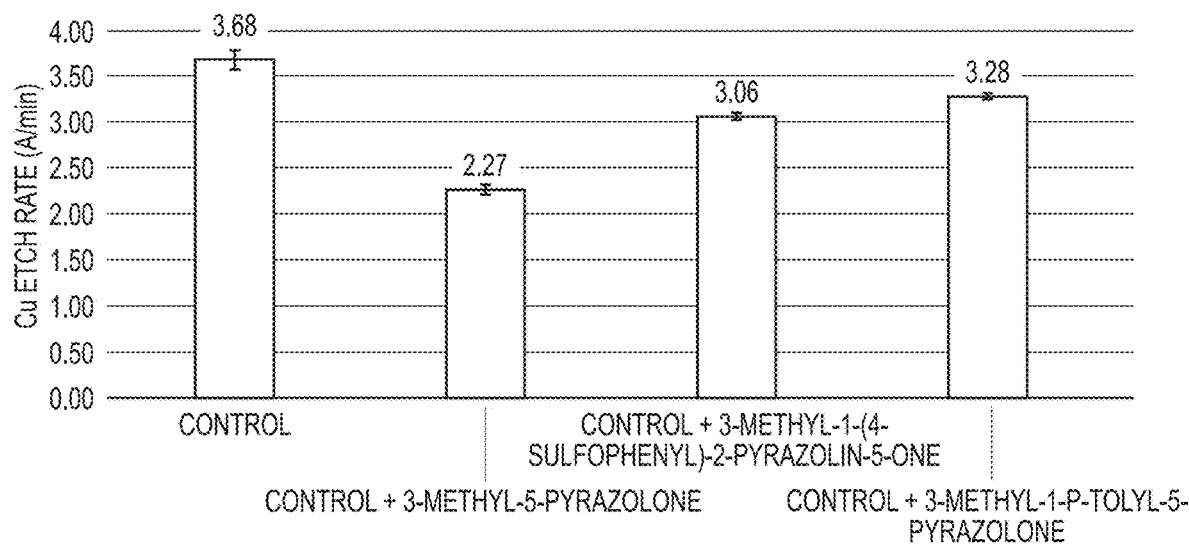
Figure 3:
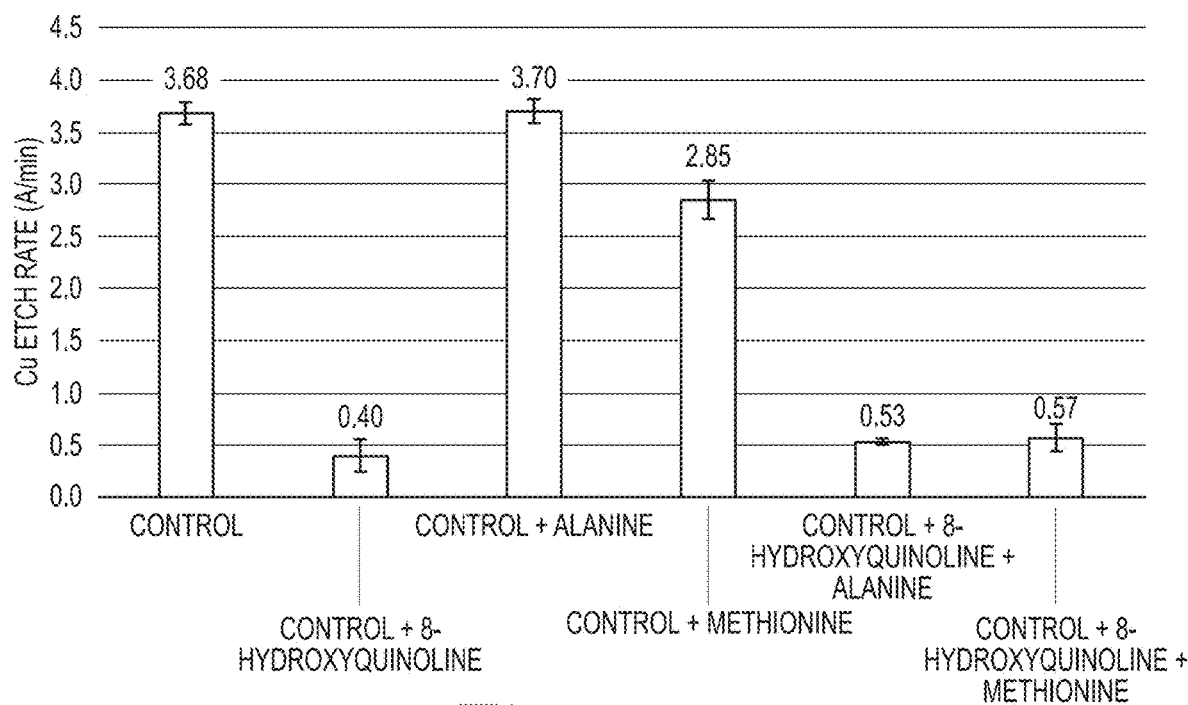
Figure 4:
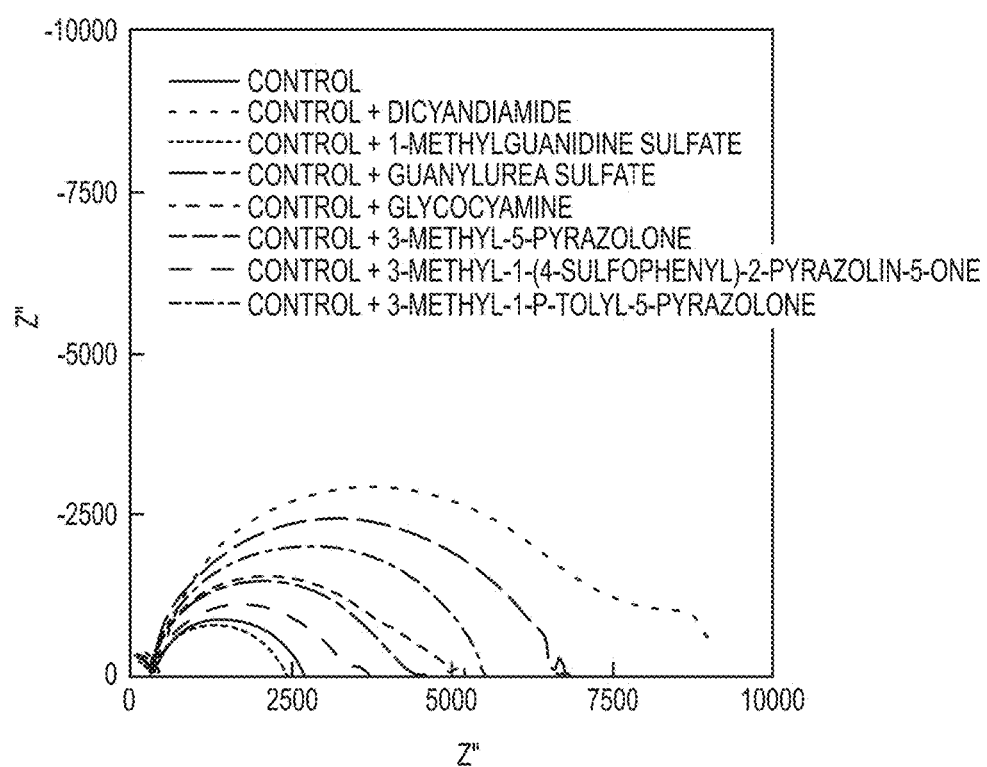
FIG. 4 shows electrochemical impedance test data for cleaning compositions as described, relative to non-inventive cleaning compositions.

The present invention relates to compositions ("cleaning compositions" or "cleaning solutions") that are useful in a cleaning process that removes residue from a surface of a microelectronic device substrate that has residue thereon. Described compositions are alkaline compositions that contain an aqueous carrier (i.e., water) along with a combination of non-aqueous ingredients that include: base, cleaning compound, and corrosion inhibitor. A composition as described may also optionally contain any one or more of various non-aqueous ingredients that may be useful in a cleaning composition, for example chelating agent, oxidizer, surfactant, buffer, biocide, organic solvent (e.g., low molecular weight alcohols, polyols), or any other minor ingredient that may be useful in a cleaning solution as described. Preferred cleaning compositions, before being used in a cleaning process, are homogeneous solutions that contain, consist of, or consist essentially of water and dissolved non-aqueous ingredients, in the absence of any solid or suspended materials such as solid abrasive particles, agglomerates, coagulates, etc.

A cleaning composition as described is useful for cleaning microelectronic devices and precursors thereof, specifically including microelectronic device substrates, meaning semiconductor wafers that include on a surface one or more microelectronic devices or precursors thereof that are in the process of being fabricated into final, completed and functional microelectronic devices. As used herein, a microelectronic device is a device that includes electrical circuits and related structures of very small (e.g., micron-scale or smaller) dimensions formed thereon. Example microelectronic devices include flat panel displays, integrated circuits, memory devices, solar panels, photovoltaics, and microelectromechanical systems (MEMS). A microelectronic device substrate is a structure such as a wafer (e.g., semiconductor wafer) that includes one or more microelectronic devices or precursors thereof, in a state of being prepared to form a final microelectronic device.

The compositions and methods described herein can be useful to clean any of various forms of microelectronic devices, at any stage of processing. Microelectronic device substrates (or simply "substrates," herein, for short) that can be cleaned with particular utility and benefit include substrates that include exposed copper, cobalt, or both, at a surface of the substrate, such as in the form of an exposed copper interconnect material or cobalt barrier layer located between an interconnect material and a dielectric or low k dielectric material.

According to the invention, the compositions can be used for cleaning these general and specific types of microelectronic device substrates to remove residues, such as but not limited to the post-CMP residue, post-ash residue, post-etch residue, or other residue present at a substrate surface following a step of processing a microelectronic device substrate. The cleaning compositions provide useful or advantageous cleaning properties, meaning that the cleaning compositions are capable of being used with known equipment (e.g., post-CMP cleaning equipment), to substantially reduce the amount of residue, contaminant, or both, at a surface of a microelectronic device substrate. A high percentage of residue that is present at a substrate surface can be successfully removed from the surface by use of cleaning compositions and methods described herein, for example at least 70, 80, 85, 90, 95, or 99 percent of residue may be removed (also referred to as "cleaning efficiency").

Methods and equipment for measuring residue at a surface of a microelectronic device substrate are well known. Cleaning efficacy may be rated based on a reduction of an amount (e.g., number) of residue particles present on a microelectronic device surface after cleaning, compared to the amount (e.g., number) of residue particles present before cleaning. For example, pre- and post-cleaning analysis may be carried out using an atomic force microscope. Residue particles on a surface may be registered as a range of pixels. A histogram (e.g., a Sigma Scan Pro) may be applied to filter the pixels in a certain intensity, e.g., 231-235, and the number of residue particles counted. The amount of residue particle removal, i.e., cleaning efficiency, may be calculated using:

(Number of PreClean Residue Particles on a Surface−Number of PostClean Residue Particles on the Surface)/(Number of PreClean Residue Particles on the Surface).

Alternately, cleaning efficacy may be considered as a percentage of a total amount of a substrate surface that is covered by residue particulate matter before, as compared to after, cleaning. For example, an atomic force microscope may be programmed to perform a z-plane scan to identify topographic areas of interest above a certain height threshold, and then calculate the area of the total surface covered by the areas of interest. A reduced amount of area determined to be areas of interest, after cleaning, indicates a more efficacious cleaning composition and cleaning process.

In addition to good cleaning efficacy, cleaning processes and cleaning compositions as described also produce a cleaned substrate surface that is affected by an advantageously low amount of corrosion of exposed metal surfaces, such as exposed metallic copper or exposed metallic cobalt. Example substrates that may be cleaned by such a process are substrates that have metallic copper or metallic cobalt at a surface, e.g., as a metal interconnect (e.g., copper interconnect), or a barrier layer material (e.g., cobalt) located between a metal interconnect and a dielectric or a low k dielectric material. Certain examples of microelectronic device substrates that be cleaned with particularly useful or advantageous results include those that contain exposed structures, at a surface, that include metallic copper (e.g., copper or an alloy thereof), metallic cobalt (e.g., cobalt or an alloy thereof), and dielectric or low k dielectric material. Corrosion inhibition of a cleaning composition can be reflected in a measurement of metal etching rate, such as static etching rate, which can be performed by known methods using known equipment.

Inventive compositions are those of the type referred to as "concentrates" (or "concentrate compositions"), as well as those referred to as "use compositions." Often, a cleaning composition (e.g., solution) is prepared and then sold in the form a concentrate, which contains water at a relatively low amount, and, consequently, a relatively concentrated amount of non-aqueous ingredients. The concentrate is prepared commercially to be sold and transported while containing the concentrated amount of non-aqueous ingredients and relatively reduced amount of water, and to be eventually diluted by a purchaser of the concentrate at a point of use. The amounts of the different non-aqueous ingredients in the concentrate are amounts that, upon dilution of the concentrate, will result in desired amounts of those non-aqueous ingredients being present in the use composition.

A cleaning composition as described includes water as a liquid carrier, preferably solute, of the non-aqueous ingredients. The water can preferably be deionized (DI) water. Water can be present in the composition from any source, such as: by being contained in an ingredient (e.g., base, cleaning compound, corrosion inhibitor) that is combined with other ingredients to produce a composition in the form of a concentrate; or as water combined in pure form to other ingredients of a concentrate; or as water added to a concentrate by a user, e.g., at a point of use, as dilution water for the purpose of diluting the concentrate to form a use composition.

The amount of water in a composition can be a desired amount for a concentrate, or a desired amount of a use composition, which is generally a higher total amount relative to the amount of water in a concentrate. Example amounts of water in a concentrate composition, not to be considered limiting, may be from about 30, 40, or 50 to about 85 or 90 weight percent, e.g., from about 60, 65, or 70 to about 80 weight percent water, based on total weight of a concentrate composition. Upon dilution, these amounts will be reduced by a factor of the dilution. Example amounts of water in a use composition may be from about 75 to about 95 weight percent, e.g., from about 82 or 85 to about 90 or 93 weight percent water based on total weight of the use composition.

The composition includes base (a.k.a. "basic compound") of a type and in an amount effective to increase the pH of the cleaning composition during use to a pH that is at least about 8, 9, or 10, e.g., to a pH in a range from about 10 to about 12, 13, or 14. The base can be any base that is useful for controlling pH of a use composition, as specified, with many different basic compounds being known for use in cleaning solutions adapted to clean a surface of a microelectronic device substrate, e.g., as a post-CMP cleaning solution.

Non-limiting examples of basic compounds include: choline hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, tetraethylammonium hydroxide (TEAH), tetrapropylammonium hydroxide (TPAH), tetrabutylammonium hydroxide (TBAH), trimethylethylammonium hydroxide, diethyldimethylammonium hydroxide, tributylmethylammonium hydroxide (TBMAH), benzyltrimethylammonium hydroxide (BTMAH), tetramethylammonium hydrochloride (TMAH), tris(2-hydroxyethyl)methyl ammonium hydroxide, diethyldimethylammonium hydroxide, guanidine acetate, 1,1,3,3-tetramethyl guanidine, guanidine carbonate, arginine, potassium hydroxide, cesium hydroxide and combinations thereof.

Examples of certain presently preferred basic compounds for use in cleaning compositions as described, in combination with the described novel and inventive corrosion inhibitors, are choline hydroxide and tetraethylammonium hydroxide (TEAH). These basic compounds may be included separately (e.g., alone) as the only basic compound in a composition; in combination with each other in a composition, i.e., as the only two basic compounds in a composition; or (either alone or in combination with each other) in combination with one or more additional (e.g., secondary) base or bases in a composition.

Certain particularly preferred cleaning compositions include base that consists of or consists essentially of: choline hydrochloride, tetraethylammonium hydroxide (TEAH), potassium hydroxide or a combination of these. Alternately, and more generally, other examples of the described cleaning compositions may include choline hydroxide, tetraethylammonium hydroxide (TEAH), potassium hydroxide or combinations of these, in combination with one or more additional base or bases that are different from choline hydroxide, potassium hydroxide and tetraethylammonium hydroxide (TEAH). Certain preferred such cleaning compositions can preferably contain not more than an insignificant amount of tetramethylammonium hydrochloride (TMAH). A cleaning composition that contains base that consists essentially of choline hydrochloride, tetraethyl amine hydroxide, potassium hydroxide or a combination of these, substantially excludes the presence of any other base (e.g., as listed hereinabove, particularly tetraethylammonium hydrochloride (TMAH)) in the cleaning composition, and will contain the choline hydrochloride, the tetraethyl amine hydroxide, or combination of these, as substantially the only base or bases in the composition; examples of this type of cleaning composition in the form of a concentrate can contain not more than 1, 0.5, 0.1, 0.05, or 0.001 weight percent TMAH based on total weight concentrate; examples in the form of a use composition can contain not more than 0.5 or 0.3 weight percent, e.g., not more than 0.1, 0.05, 0.03, 0.01, 0.005, or 0.0005 weight percent TMAH based on total weight use composition.

The amount (measured as non-aqueous solids) of base included in a cleaning composition can depend on the type of the base (or bases), and can be a total amount of base that upon dilution to a use composition will produce a desired pH, e.g., a pH that is at least 8, 9, or 10, such as a pH in a range from about 10 to 14, 10 to 13, or 10 to 12, in the use composition.

When measured as the non-aqueous, i.e., "solid" chemical component of the base (including all components of a basic compound, e.g., hydroxy anion of a basic compound that includes hydroxy ion), example cleaning compositions can contain from about 3 to 95 parts by weight (pbw) total base (solids, e.g., choline hydroxide, TEAH, potassium hydroxide or a combination thereof), e.g., from 5 to 70 or 90 pbw base per 100 parts by weight of a total amount of: base (all types), cleaning compound (all types), and corrosion inhibitor (all types) of a composition (these relative amounts of base, having a basis of 100 parts by weight of the three specified non-aqueous ingredients in a composition, are independent of the presence or the amount of any water in the composition, and will be the same on a relative basis regardless of whether the cleaning composition is a concentrate or a use composition).

Stated in alternate terms, example compositions can contain from about 3 to 95, e.g., 5 to 70 or 90 parts by weight (pbw) base (e.g., choline hydroxide, TEAH, potassium hydroxide or a combination thereof) per 100 parts by weight of a total amount of non-aqueous ingredients of a composition including base (all types), cleaning compound (all types), corrosion inhibitor (all types), and any other optional ingredients such as chelating agent, oxidizer, surfactant, buffer, organic solvent, and the like, present in the composition.

Examples of useful and preferred amounts of base (non-aqueous "solid" base material) can in alternate terms be described as a weight percentage of a total weight of a cleaning composition, with relevant percentages of an ingredient being potentially different for a concentrate composition (which will have higher relative amounts of non-aqueous ingredients) as compared to a use composition (which will have relatively lower amounts of non-aqueous ingredients). In terms of weight percent, certain example concentrate compositions of the present description can include from about 3 to 60 weight percent base per total weight of a concentrate composition. Certain example use compositions can include from about 0.4 to 10 weight percent base, e.g., from 0.6 to 8, or 0.7 to 4, 5, 6 weight percent base, per total weight of a use composition.

A cleaning composition as described also includes cleaning compound. A cleaning compound can be a compound that is effective to increase the cleaning capability (e.g., efficacy, efficiency, etc.) of the cleaning composition, for example by acting as a solvent that may facilitate removal of residue from a substrate surface by dissolving the residue, by forming a complex with the residue, or by otherwise chemically interacting with the residue to allow removal of the residue from a surface of a substrate that is being cleaned.

The cleaning composition may include a single type of cleaning compound or a combination of two or more different types of cleaning compounds, as desired. The type and amount of the one or more cleaning compounds can be any that will result in desired performance of a use composition (e.g., good cleaning and acceptable or advantageous levels of corrosion resistance, low levels of defects, etc.), and that can preferably also produce a concentrate that exhibits useful performance and stability properties.

As one cleaning compound, example cleaning compositions of the present description can include alkanol amine. Alkanol amines are chemical compounds that include an amine group that is substituted by at least one alkanol group. The alkanol amine can be any alkanol amine that will be effective as a cleaning compound as described, including primary, secondary, and tertiary amine compounds. The alkanol amine compound will have at least one alkanol substituent (e.g., methanol, ethanol, etc.), and one, two, or three alkanol, alkyl, or alternate organic substituents. Certain useful alkanol amines are primary alkanol amines such as monoethanol amine (MEA), aminoethylethanolamine, N-methylaminoethanol, aminoethoxyethanol, aminoethoxyethoxyethanol, butoxypropylamine, methoxypropylamine, butoxyisopropylamine, 2-ethylhexylisopropoxyamine, ethanolpropylamine, ethylethanolamine, n-hydroxyethylmorpholine, aminopropyldiethanolamine, dimethylaminoethoxyethanol, diethanolamine, N-methyldiethanolamine, monoethanolamine, triethanolamine, 1-amino-2-propanol, 3-amino-1-propanol, diisopropylamine, aminomethylpropanediol, N,N-dimethylaminomethylpropanediol, aminoethylpropanediol, N,N-dimethylaminoethylpropanediol, isopropylamine, 2-amino-1-butanol, aminomethylpropanol, aminodimethylpropanol, N,N-dimethylaminomethylpropanol, isobutanolamine, diisopropanolamine, 3-amino,4-hydroxyoctane, 2-aminobutylanol, tris(hydroxymethyl)aminomethane (TRIS), N,N-dimethyltris(hydroxymethyl) aminomethane, hydroxyproplyamine, benzylamine, hydroxyethyl amine, tris(hydroxyethyl)aminomethane, triethylenediamine, tetraethylenepentamine (TEPA), triethylenetetraamine, ethylenediamine, hexamethylenediamine, diethylenetriamine, triethylamine, trimethylamine, diglycolamine; morpholine and combinations thereof.

Optionally, the composition can contain alkanol amine as a cleaning compound along with an additional (i.e., "secondary") cleaning compound. Examples include organic solvents, water soluble polymers, or surfactants. The secondary cleaning compound can be any compound that can be included as an effective cleaning compound in combination with other ingredients in a cleaning composition. Some specific examples of secondary cleaning compounds include: morpholine, L-cysteine, hydroxyl ethyl cellulose, a polyamine, a glycol ether (e.g., propylene glycol n-butyl ether), of alginic acid and salts thereof; carboxymethylcellulose; dextran sulfate and salts thereof; poly(galacturonic acid) and salts thereof; homopolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; copolymers of (meth) acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; chitosan; cationic starch; polylysine and salts thereof; homopolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; and co-polymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; cocodimethylcarboxymethylbetaine; lauryldimethylcarboxymethylbetaine; lauryldimethyl-alpha-carboxyethylbetaine; cetyldimethylcarboxymethylbetaine; lauryl-bis-(2-hydroxyethyl)carboxymethylbetaine; stearyl-bis-(2-hydroxypropyl) carboxymethylbetaine; oleyldimethyl-gamma-carboxypropylbetaine; lauryl-bis-(2-hydroxypropyl)alpha-carboxyethylebetaine; cocodimethylsulfopropylbetaine; stearyldimethylsulfopropylbetaine; lauryl-bis-(2-hydroxyethyl)sulfopropylbetaine; sodium dodecylsulfate; dioctyl sulfosuccinate sodium salt; sodium lauryl ether sulfate; polyethylene glycol branched-nonylphenyl ether sulfate ammonium salt; disodium 2-dodecyl-3-(2-sulfonatophenoxy); PEG25-PABA; polyethylene glycol mono-C10-16-alkyl ether sulfate sodium salt; (2-N-butoxyethoxy)acetic acid; hexadecylbenzene sulfonic acid; cetyltrimethylammonium hydroxide; dodecyltrimethylammonium hydroxide; dodecyltrimethyl ammonium chloride; cetyltrimethyl ammonium chloride; N-Alkyl-N-benzyl-N,N-dimethylammonium chloride; dodecylamine; polyoxyethylene lauryl ether; dodecenylsuccinic acid monodiethanol amide; ethylenediamine tetrakis (ethoxylate-block-propoxylate); 2-pyrrolidinone, 1-(2-hydroxyethyl)-2-pyrrolidinone (HEP), glycerol, 1,4-butanediol, tetramethylene sulfone (sulfolane), dimethyl sulfone, ethylene glycol, propylene glycol, dipropylene glycol, tetraglyme, diglyme, a glycol ether (e.g., diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether (DOWANOL PnB), dipropylene glycol n-butyl ether, tripropylene glycol n-butyl ether, propylene glycol phenyl ether (DOWANOL PPh)), and combinations thereof.

Alternatively, or in addition, the cleaning composition can include organic additive selected from: phosphonic acid and derivatives thereof such as 1-hydroxyethylidene-1,1-diphosphonic acid (HEDP), 1,5,9-triazacyclododecane-N,N',N''-tris(methylenephosphonic acid) (DOTRP), 1,4,7,10-tetraazacyclododecane-N,N',N'',N'''-tetrakis (methylenephosphonic acid) (DOTP), nitrilotris(methylene) triphosphonic acid, diethylenetriaminepenta (methylenephosphonic acid) (DETAP), aminotri (methylenephosphonic acid), is(hexamethylene)triamine phosphonic acid, 1,4,7-triazacyclononane-N,N',N''-tris (methylenephosphonic acid (NOTP), salts thereof, and derivatives thereof.

Alternatively, or in addition, the cleaning composition can include organic additive selected from hydroxypropylcellulose, hydroxyethylcellulose, carboxymethylcellulose, sodium carboxymethylcellulose (Na CMC), polyvinylpyrrolidone (PVP), any polymer made using the N-vinyl pyrrolidone monomer, polyacrylic acid esters and analogues of polyacrylic acid esters, polyaminoacids (e.g., polyalanine, polyleucine, polyglycine), polyamidohydroxyurethanes, polylactones, polyacrylamide, Xanthan gum, chitosan, polyethylene oxide, polyvinyl alcohol (PVA), polyvinyl acetate, polyacrylic acid, polyethyleneimine (PEI), sugar alcohols such as sorbitol and xylitol, esters of anhydrosorbitols, secondary alcohol ethoxylates such as TERGITOL, and combinations thereof.

In a preferred embodiment, at least one organic additive comprises HEDP. In another preferred embodiment, at least one organic additive comprises at least one glycol ether comprising triethylene glycol monobutyl ether or propylene glycol n-butyl ether or propylene glycol phenyl ether. In yet another preferred embodiment, at least one organic additive comprises HEDP and at least one glycol ether comprising triethylene glycol monobutyl ether or propylene glycol n-butyl ether or propylene glycol phenyl ether. In still another preferred embodiment, at least one organic additive comprises HEC or a combination of HEDP and HEC or a combination of HEC, HEDP, and at least one glycol ether comprising triethylene glycol monobutyl ether or propylene glycol n-butyl ether or propylene glycol phenyl ether or a combination of HEC and at least one glycol ether comprising triethylene glycol monobutyl ether or propylene glycol n-butyl ether or propylene glycol phenyl ether and combinations thereof.

The cleaning composition can include any useful amount of cleaning compound, e.g., alkanol amine and optional secondary cleaning compound such as one or more of those listed specifically herein. For example, a cleaning composition can contain from about 0.01 to 80 parts by weight (pbw) total cleaning compound (any type), e.g., 0.02 to 70 pbw cleaning compound, per 100 parts by weight of a total amount of: base (all types), cleaning compound (all types), and corrosion inhibitor (all types) of a composition (these relative amounts of cleaning compound, having a basis of 100 parts by weight of the three specified ingredients in a composition, are independent of the presence or the amount of any water in the composition and will be the same on a relative basis regardless of whether the cleaning composition is a concentrate or a use composition).

In alternate terms, an example composition can contain from about 0.01 to 80, e.g., 0.02 to 40 parts by weight (pbw) cleaning compound per 100 parts by weight of a total amount of non-aqueous ingredients in a composition (e.g., base (all types), cleaning compound (all types), corrosion inhibitor (all types), and optional ingredients such as chelating agent, oxidizer, surfactant, buffer, organic solvent, and the like).

In terms of weight percent, certain example compositions can contain from about 0.01 to 80 weight percent cleaning compound (all types), e.g., from about to 0.02 to 70 weight percent cleaning compound, per total weight of a concentrate composition. Certain example use compositions can include from about 0.01 to 4 weight percent cleaning compound, e.g., from 0.02 to 4 weight percent cleaning compound, per total weight of a use composition.

Consistent with the above, certain preferred example cleaning compositions contain alkanol amine (e.g., MEA) as cleaning compound in combination with one or more secondary cleaning compounds such as one or more of those specifically identified herein. Such a cleaning composition can include the alkanol amine in a range from about 0.5 to 20 parts by weight (pbw) alkanol amine, e.g., 1 to 10 pbw alkanol amine, per 100 parts by weight of a total amount of: base (all types), cleaning compound (all types), and corrosion inhibitor (all types) of a composition.

Alternately, example composition can contain from about 0.3 to 5, e.g., 0.4 to 4 parts by weight (pbw) alkanol amine per 100 parts by weight of a total amount of non-aqueous ingredients of a composition (e.g., base (all types), cleaning compound (all types), corrosion inhibitor (all types), and optional ingredients such as chelating agent, oxidizer, surfactant, buffer, organic solvent, and the like).

In terms of weight percent, these example compositions, including alkanol amine and one or more secondary cleaning compound may contain from about 0.5 to 5 weight percent alkanol amine, e.g., from about 0.7 to 3 weight percent alkanol amine, per total weight of a concentrate composition. Certain example use compositions can include from about 0.05 to 3 weight percent alkanol amine, e.g., from 0.07 to 2.5 weight percent alkanol amine and secondary cleaning compound per total weight of a use composition.

Certain example compositions can contain cleaning compound that consists or consists essentially of: alkanol amine (e.g., MEA) and optional secondary cleaning compound selected from: morpholine, L-cysteine, hydroxyl ethyl cellulose, polyamine, glycol ether, and combinations thereof. A composition that contains cleaning compound that consists essentially of alkanol amine (e.g., MEA) and optional secondary cleaning compound selected from: morpholine, L-cysteine, hydroxyl ethyl cellulose, polyamine, glycol ether or a combination thereof, is a composition that contains (as cleaning compound) only alkanol amine (e.g., MEA) and one or more of the listed optional secondary cleaning compounds, with not more than 0.5, 0.1, 0.05, or 0.01 weight percent of any other cleaning compound, based on total weight cleaning compound in the composition list in early descriptions or organic cleaning additives.

A cleaning composition as described also includes metal corrosion inhibitor (i.e., "corrosion inhibitor"), which is any compound that reduces the amount (e.g., rate) of corrosion of a metal on a substrate surface that occurs during use of the cleaning composition to clean the substrate. According to the invention, a cleaning composition as described includes corrosion inhibitor selected from: various guanidine functional additives such as dicyandiamide, galegene, guanylurea, guanylurea salts (phosphate, sulfate, chloride, nitrate, dinitramide), guanidine and guanidine salts (sulfate, carbonate, chloride, acetate, lactate, nitrate, phosphate, thiocyanate), 1-methylguanidine sulfate, arginine, methylarginine, arginosuccinic acid, β-guanidinopropionic acid, triazabicyclodec-5-ene, creatine, creatinine, benzylamiloride, cariporide, gualfacine, biguanides, glycocyamine; various pyrazolone functional additives such as 2-methyl-3-butyn-2-ol, 3-methyl-2-pyrazolin-5-one such as 3-methyl-1-4sulfophenyl)-2-pyrazolin-5-one or 3-methyl-1-p-tolyl-5-pyrazolone; and hydroxyquinoline compounds such as 8-hydroxyquinoline and related compounds (8-hydroxyquinoline-2-carboxylic acid, 5-chloro7-iodo-quinolin-8-ol, 5,7-dichloro-2-[(dimethylamino)methyl]quinolin-8-ol, 8-hydroxyquinoline-4-carbaldehyde, 8-hydroxyquinoline-4-carbaldehyde-oxime, 8-hydroxyquinoline-5-sulfonic acid monohydrate) and combinations thereof.

Dicyandiamide is a known chemical compound having the formula:

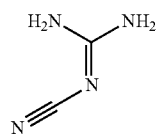

Dicyandiamide, also known as "2-cyanoguanidine" as well as "dicyanodiamide," can be made by known methods of treating cyanamide with base, and is commercially available. The compound 2-Methyl-3-butyn-2-ol, (a.k.a., dimethylpropargyl alcohol (CAS No 115-19-5)), is also commercially available, as is the compound 3-methyl-2-pyrazolin-5-one (CAS No 108-26-9). Arginine CAS number 7200-25-1 & 74-79-3.

Any of these corrosion inhibitor compounds may be used in a cleaning composition separately, or in any useful combination of two or more of the identified corrosion inhibitor compounds (e.g., with each other), or may be used separately or in any useful combination, additionally with one or more other (e.g., "secondary") corrosion inhibitors. Examples of useful secondary corrosion inhibitors, not to be construed as limiting the present invention to these secondary corrosion inhibitors, including oxalic acid, succinic acid, L&+-tartaric acid, citric acid, and combinations of these.

A cleaning composition as described can include any useful amount of corrosion inhibitor ("inhibitor"), e.g., dicyandiamide, 2-methyl-3-butyn-2-ol, 3-methyl-2-pyrazolin-5-one, arginine, etc., separately or in combination, along with any optional secondary inhibitor such as one or more of those listed specifically herein. For example, a cleaning composition can contain from about 0.1 or 0.5 to 1 or 4 parts by weight (pbw) total corrosion inhibitor (any type), e.g., from 0.5 to 4 pbw corrosion inhibitor per 100 parts by weight of a total amount of: base (all types), cleaning compound (all types), and corrosion inhibitor (all types) of a composition.

In alternate terms, an example composition can contain from about 0.01 or 0.3 to 1 or 2, e.g., 0.05 to 1.5 or 2 parts by weight (pbw) corrosion inhibitor per 100 parts by weight of a total amount of non-aqueous ingredients of a composition (e.g., base (all types), cleaning compound (all types), corrosion inhibitor (all types), and optional ingredients such as chelating agent, oxidizer, surfactant, buffer, organic solvent, and the like).

In terms of weight percent, certain example compositions of the present description can include from about 0.05 to 4 weight percent corrosion inhibitor (all types), e.g., from about to 0.08 to 3 weight percent corrosion inhibitor per total weight of a concentrate composition. Certain example use compositions can include from about 0.01 to 3 weight percent inhibitor, e.g., from 0.01 to 1.5 or 2 weight percent corrosion inhibitor, per total weight of a use composition.

Consistent with the above, certain preferred example cleaning compositions contain at least one of dicyandiamide, 2-methyl-3-butyn-2-ol, and 3-methyl-2-pyrazolin-5-one, or a combination thereof, as corrosion inhibitor, in combination with one or more secondary corrosion inhibitor such as one of those specifically identified herein. Such a cleaning composition can include the dicyandiamide, 2-methyl-3-butyn-2-ol, 3-methyl-2-pyrazolin-5-one, or combination thereof, in an amount in a range from about 0.4 to 6 parts by weight (pbw), e.g., 0.6 to 6 pbw, per 100 parts by weight of a total amount of: base (all types), cleaning compound (all types), and corrosion inhibitor (all types) of a composition.

Alternately stated, example compositions can contain from about 0.25 to 5, e.g., 0. to 4 parts by weight (pbw) dicyandiamide, 2-methyl-3-butyn-2-ol, and 3-methyl-2-pyrazolin-5-one, or combination thereof, per 100 parts by weight of a total amount of non-aqueous ingredients of a composition (e.g., base (all types), cleaning compound (all types), corrosion inhibitor (all types), and optional ingredients such as chelating agent, oxidizer, surfactant, buffer, organic solvent, and the like).

In terms of weight percent, these example compositions, including dicyandiamide, 2-methyl-3-butyn-2-ol, 3-methyl-2-pyrazolin-5-one, or a combination thereof, may contain from about 0.05 to 1.5 weight percent dicyandiamide, 2-methyl-3-butyn-2-ol, 3-methyl-2-pyrazolin-5-one, or a combination thereof, e.g., from about 0.07 to 1 weight percent dicyandiamide, 2-methyl-3-butyn-2-ol, or 3-methyl-2-pyrazolin-5-one, or a combination thereof per total weight of a concentrate composition. Certain example use compositions can include from about 0.005 to 1 weight percent dicyandiamide, 2-methyl-3-butyn-2-ol, or 3-methyl-2-pyrazolin-5-one, or a combination thereof, e.g., from 0.007 to 0.8 weight percent dicyandiamide, 2-methyl-3-butyn-2-ol, 3-methyl-2-pyrazolin-5-one, or a combination thereof per total weight of a use composition.

These and other example cleaning compositions can contain corrosion inhibitor that consists or consists essentially of dicyandiamide, 2-methyl-3-butyn-2-ol, 3-methyl-2-pyrazolin-5-one, or a combination thereof, optionally also in combination with a secondary corrosion inhibitor selected from the oxalic acid, succinic acid, L-tartaric acid, and combinations of these. A composition that contains corrosion inhibitor that consists essentially of dicyandiamide, 2-methyl-3-butyn-2-ol, 3-methyl-2-pyrazolin-5-one, or a combination thereof, optionally also in combination with a secondary corrosion inhibitor selected from oxalic acid, succinic acid, L-tartaric acid, and combinations of these, is a composition that includes only those specified corrosion inhibitors (and optional corrosion inhibitors) along with not more than 0.5, 0.1, 0.005, or 0.01 weight percent of any other corrosion inhibitor, based on total weight of corrosion inhibitor in the composition.

Consistent with the foregoing, examples of certain cleaning compositions can consist of or consist essentially of water, base (e.g., selected from bases that are specifically mentioned herein), cleaning compound (e.g., selected from those specifically mentioned herein), and corrosion inhibitor (e.g., selected from those specifically listed herein). A composition that consists essentially of water, base, cleaning compound, and corrosion inhibitor as described can contain those ingredients and not more than 0.5, 0.1, 0.05, or 0.01 weight percent of any other ingredients.

In preferred compositions, the corrosion inhibitor, in combination with the other ingredients of the cleaning composition will produce a composition that, overall, produces desired, useful, or advantageous cleaning performance of the cleaning composition, along with reduced metal corrosion, e.g., reduced corrosion of exposed copper, cobalt, or both, as compared to corrosion that would occur by use of a comparable cleaning composition, such an otherwise comparable cleaning composition that does not contain an inventive corrosion inhibitor.

Optionally, in addition to water, base, cleaning composition (as described) and corrosion inhibitor, a cleaning composition may also, optionally, include other non-particulate, non-aqueous chemical ingredients that are dissolved in the composition and that may improve the cleaning effect or other performance feature of the composition. Examples of such optional ingredients include certain types of ingredients that are known in the arts of semiconductor processing, fabrication, and cleaning, including post-CMP cleaning. These include ingredients that are generally understood to improve the performance (e.g., cleaning effect) of a cleaning composition, by any mode; example materials may be generally considered to be a cleaning compound, corrosion inhibitor, or base (as these terms are used herein) and may more particularly be characterized in terms of a chemical function, e.g., as: a chelating agent (e.g., "complexing agent"), oxidizer, surfactant, buffer (pH buffer), biocide, organic solvent, etc.

The term "complexing agent" is used herein in a manner that is consistent with the use of this term in the semiconductor processing and cleaning (e.g., post-CMP cleaning) arts, and refers to chemical complexing agents, chelating agents, and sequestering agents, which are compounds that are known to chemically complex with or physically hold (sequester) a metal atom or metal ion during a process of using a cleaning composition as described herein to removed residue from a surface of a microelectronic device These agents can be acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypryidine, 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, p-toluenesulfonic acid, salicylhyroxyamic, 5-sulfosalicylic acid, and combinations thereof.

The terms "oxidizer" and "oxidizing agent" are used herein in a manner consistent with the use of these terms in the semiconductor processing and cleaning (e.g., post-CMP cleaning) arts. Example oxidizers include inorganic and organic per-compounds, which include compounds that contain at least one peroxy group (—O—O—), and compounds that contain an element in its highest oxidation state. Examples include hydrogen peroxide and its adducts such as urea hydrogen peroxide and percarbonate; organic peroxides such as benzoyl peroxide, peracetic acid, and di-t-butyl peroxide; dipersulfates ($S_2O_8^=$); monopersulfates ($SO_5^=$); sodium peroxide; periodate salts; perbromic acid; periodic acid; perbromate salts; perchloric acid; perchlorate salts; perboric acid; perborate salts; and permanganates.

As used herein, the term "surfactant" is used a manner that is consistent with its use in the chemical, semiconductor processing, and semiconductor cleaning (e.g., post-CMP cleaning) arts. Consistent therewith, a "surfactant" is an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group.

Thus, in addition to the base compounds, cleaning compounds, and corrosion inhibitors that are specifically identified herein, a cleaning composition can include additional ingredients useful to improve performance, such ingredients sometimes being referred to as chelating agents ("complexing agents"), oxidizers, surfactants, buffers, biocide, organic solvent, and other useful types of minor ingredients. Alternately, certain embodiments of compositions of the present description can avoid, specifically exclude, or use only a small amount of ingredients that are different from an in addition to the base compounds, cleaning compounds, and corrosion inhibitors that are specifically identified herein. Example compositions can include any one of these non-aqueous ingredients (different from a base compound, cleaning compound, or corrosion inhibitor specifically identified herein) in not more than a limited or insubstantial amount, for example in an amount that is less than 1, 0.1, 0.05, 0.01, or 0.001 weight percent of any such compound based on total weight composition (concentrate or use composition).

The cleaning compositions are useful for removing residue from a surface of a substrate, and are not intended to remove any substantial amount of material from the substrate surface itself, e.g., as would occur in a step of chemical-mechanical processing by the presence of chemical or abrasive materials in a CMP slurry. Accordingly, a cleaning composition as described may exclude any more than insubstantial amount of solid abrasive particles that would be effective to mechanically (by abrasion) remove material that makes up the substrate surface (as opposed to residue that resides on the surface). Examples of such excluded abrasive particles are well known in the CMP and semiconductor treatment arts, and include solid (non-dissolved) particles made of or containing materials that include metals and metal oxide materials (e.g., aluminum, alumina, etc.); silicon-based materials such as silica or silicon oxide; ceria and ceria-based materials; zirconia and zirconia-based materials; and others. Example compositions of the present description can contain less than 0.1, 0.05, 0.01, or 0.001 weight percent of any such solid (non-dissolved) abrasive particles (total), based on total weight composition (concentrate or use composition).

A cleaning composition can be easily prepared by simple addition of the respective ingredients and mixing to homogeneous condition, such as a solution. Furthermore, a composition may be readily formulated as single-package formulations or multi-part formulations that are mixed at or before the point of use, e.g., the individual parts of the multi-part formulation may be mixed by a user either at a processing tool (cleaning apparatus) or in a storage tank upstream of the processing tool.

A composition as described may be provided commercially for sale in the form of a concentrate that can be diluted with an appropriate amount of water at a point of use, i.e., to a "use composition." In a concentrate form, the composition (concentrate) includes non-aqueous ingredients (e.g., base, cleaning compound, corrosion inhibitor, and other optional ingredients) that will be present in the concentrate in amounts such that when the concentrate is diluted with a desired amount of water (e.g., DI water) each component of the cleaning composition will be present in the diluted use composition in an amount that is desired for use in a cleaning step such as a post-CMP cleaning step. The amount of water added to the concentrate to form the use composition may be one or multiple volumes of water per volume of the concentrate, for example 2 volumes of water (e.g., 3, 4, 5, or 10 volumes of water) per volume of the concentrate. When the concentrate is diluted with such an amount of water, each of the solid components of the concentration will be present in the use composition in a concentration that is reduced based on the number of volumes of water added to dilute the concentrate.

A cleaning composition as described can be useful in microelectronic device processing applications that include processes for cleaning a substrate surface by a method such as post-etch residue removal, post-ash residue removal surface preparation, post-CMP residue removal, and the like. Example substrates that may be cleaned by such a process include substrates that include metallic copper, metallic cobalt, or both, at a surface, e.g., as a metal interconnect (e.g., copper interconnect), or a barrier layer material (e.g., cobalt) that is located between a metal interconnect and a dielectric or a low k dielectric material. Certain examples of microelectronic device substrates that be cleaned with particularly useful or advantageous results include those that contain exposed structures, at a surface, that include metallic copper (e.g., copper or an alloy thereof), metallic cobalt (e.g., cobalt or an alloy thereof), and dielectric or low k dielectric material. Corrosion inhibition of a cleaning composition can be reflected in a measurement of metal etching rate, such as static etching rate, which can be performed by known methods using known equipment.

A cleaning composition and cleaning method are preferably effective to remove a substantial amount of residue from the surface, of an amount that is initially present at the surface before the cleaning step. At the same time, the composition and method are effective without causing undue damage to a dielectric material or low k dielectric material that also is present at the surface, and without causing undue corrosion to metal interconnect or barrier layer materials such as metallic copper, cobalt, or both, also present at surfaces of select substrates. Preferably a cleaning composition can be effective, in a cleaning step, to remove at least 85 percent of residue present on a surface of the substrate prior to residue removal by a cleaning step, more preferably at least 90 of residue, even more preferably at least 95 percent of residue, and most preferably at least 99 percent of residue initially present before the cleaning step.

In a cleaning step, such as a post-CMP residue cleaning steps, a cleaning composition may be used with any of a variety of known, conventional, commercially available cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

Conditions and timing of a cleaning step can be as desired, and may vary depending on the type of substrate and residue. In use of a composition for cleaning post-CMP residue, post-etch residue, post-ash residue or contaminants from a microelectronic device substrate having same thereon, the cleaning composition may be contacted with the substrate surface for a time of from about 1 second to about 20 minutes, e.g., from about 5 second to 10 minutes, or from about 15 sec to about 5 minutes, at temperature in a range of from about 20° Celsius to about 90° Celsius, preferably about 20° Celsius to about 50° Celsius. Such contacting times and temperatures are illustrative, and any other suitable time and temperature conditions may be useful if efficacious to at least partially, preferably substantially, clean an initial amount of residue from a surface.

Following desired level of cleaning of a device substrate surface, the cleaning compositions used in a cleaning step may be readily removed from the device surface, as may be desired and efficacious in a given end use application. For example, removal may be performed by use of a rinse solution that includes deionized water. Thereafter, the device may be processed as desired, such as by being dried (e.g., using nitrogen or a spin-dry cycle), followed by subsequent processing of the cleaned and dried device surface.

In other more general or specific methods, a microelectronic device substrate may first be subjected to processing step that includes by any one or more of CMP processing, plasma etching, wet etching, plasma ashing, or the like, followed by a cleaning step that includes cleaning the substrate surface with a cleaning composition of the present description. At the end of the first processing step, residue (e.g., post-etch residue, post-CMP residue, post ash residue, etc.) will be present at a surface of the substrate. The cleaning step, using a cleaning composition as described, will be effective to clean a substantial amount of the residue from the microelectronic device surface.

EXAMPLES

Some example cleaning compositions can consist of (or, alternatively, consist essentially of) various guanidinium compounds, monoethanolamine, and potassium hydroxide. See Table 1:

TABLE 1

| Raw Materials | CAS # | control | control + dicyandiamide | control + guanidine carbonate | control + 1-methyl guanidine sulfate | control + guanylurea sulfate | control + glycocyamine |
|---|---|---|---|---|---|---|---|
| MEA | 141-43-5 | 4.500 | 4.500 | 4.500 | 4.500 | 4.500 | 4.500 |
| dicyandiamide | 461-58-5 | | 0.520 | | | | |
| guanidine carbonate | 593-85-1 | | | 0.560 | | | |
| 1-methylguanidine sulfate | 598-12-9 | | | | 1.510 | | |
| guanylurea sulfate | 591-01-5 | | | | | 1.870 | |
| glycocyamine | 352-97-6 | | | | | | 0.730 |
| pH adjusted by KOH | | 13.500 | 13.500 | 13.500 | 13.500 | 13.500 | 13.500 |

Other example cleaning compositions can consist of (or, alternatively, consist essentially of) various pyrazolones, monoethanolamine, and potassium hydroxide. See Table 2:

TABLE 2

| Raw Materials | CAS # | control | control + 3-methyl-5-pyrazolone | control + 3-methyl-1-(4-sulfophenyl)-2-pyrazolin-5-one | control + 3-methyl-1-p-tolyl-5-pyrazolone |
|---|---|---|---|---|---|
| MEA | 141-43-5 | 4.500 | 4.500 | 4.500 | 4.500 |
| 3-methyl-5-pyrazolone | 461-58-5 | | 0.610 | | |
| 3-methyl-1-(4-sulfophenyl)-2-pyrazolin-5-one | 593-85-1 | | | 1.580 | |
| 3-methyl-1-p-tolyl-5-pyrazolone | 598-12-9 | | | | 1.170 |
| pH adjusted by KOH | | 13.500 | 13.500 | 13.500 | 13.500 |

Still other example cleaning compositions can consist of (or consist essentially of) 8-hydroxyquinoline, monoethanolamine, various aminoacids, and potassium hydroxide. See Table 3:

TABLE 3

| Raw Materials | CAS # | control | control + 8-hydroxy quinoline | control + alanine | control + methionine | control + 8-hydroxy quinoline + alanine | control + 8-hydroxy quinoline + methionine |
|---|---|---|---|---|---|---|---|
| MEA | 141-43-5 | 4.500 | 4.500 | 4.500 | 4.500 | 4.500 | 4.500 |
| 8-hydroxyquinoline | 148-24-3 | | 0.900 | | | 0.900 | 0.900 |
| alanine | 56-41-7 | | | 0.550 | | 0.550 | |
| methionine | 63-68-3 | | | | 0.925 | | 0.925 |
| pH adjusted by KOH | | 13.500 | 13.500 | 13.500 | 13.500 | 13.500 | 13.500 |

Table 1-3 show formulations of various cleaning compositions as described herein, as well as comparable cleaning compositions that contain comparable base and other ingredients without any of the corrosion inhibitors described herein. The performance of each of these compositions was compared with respect to copper etching rate and electrochemical impedance results. See FIGS. 1 through 4.

Etching rate, i.e., static etch rate, is a measure of an amount of metal that is removed from a metal surface upon exposing the surface to certain material, such as a cleaning composition. As shown at FIG. 1, inventive cleaning compositions that contain corrosion inhibitors as described herein, with specific base materials, exhibit lower etch rates as compared to the control solution.

Corrosion of metal surface features is responsible for a high share of microelectronic device failures. Corrosion of metal at a surface of a microelectronic device can occur during processing, such as during a cleaning step, which means that processing steps should not encourage and should preferably reduce, inhibit, or prevent the occurrence of corrosion of surface features of microelectronic devices. Corrosion inhibition can be measured by use of electrochemical impedance spectroscopy. As shown in Nyquist plots at FIG. 4, inventive cleaning compositions that contain corrosion inhibitors as described herein with specific base materials, cause a higher degree of copper passivation, as compared to a cleaning composition that does not contain any the inventive corrosion inhibitors.

The invention claimed is:

1. A cleaning composition effective to clean a microelectronic device substrate, the cleaning composition comprising:
water,
base to provide a pH of at least 8,
a cleaning compound, and
a corrosion inhibitor selected from:
a guanidine functional compound selected from dicyandiamide, guanylurea, a guanidine salt, and glycocyamine,
2-methyl-3-butyn-2-ol,
a pyrazolone functional compound selected from 3-methyl-2-pyrazolin-5-one, 3-methyl-1-(4-sulfophenyl)-2-pyrazolin-5-one, and 3-methyl-1-p-tolyl-5-pyrazolone, and
a hydroxyquinoline compound selected from 8-hydroxyquinoline-2-carboxylic acid, 5-chloro-7-iodo-quinolin-8-ol, 5,7-dichloro-2-((dimethylamino)methyl)quinolin-8-ol, 8-hydroxyquinoline-4-carbaldehyde, 8-hydroxyquinoline-4-carbaldehyde-oxime, and 8-hydroxyquinoline-5-sulfonic acid monohydrate.

2. A cleaning composition of claim 1, wherein the corrosion inhibitor is selected from dicyandiamide and 2-methyl-3-butyn-2-ol.

3. A cleaning composition of claim 1, wherein the base is selected from: choline hydroxide, tetraethylammonium hydroxide, tetramethylammonium hydroxide, a quaternary ammonium compound, and a combination thereof.

4. A cleaning composition of claim 1, wherein the cleaning compound is an alkanol amine.

5. A cleaning composition of claim 1, wherein the corrosion inhibitor is dicyandiamide, guanylurea sulfate, or, glycocyamine.

6. A cleaning composition of claim 1, wherein the corrosion inhibitor is dicyandiamide.

7. A cleaning composition of claim 1, wherein the corrosion inhibitor is 3-methyl-2-pyrazolin-5-one, 3-methyl-1-(4-sulfophenyl)-2-pyrazolin-5-one, or 3-methyl-1-p-tolyl-5-pyrazolone.

8. A cleaning composition of claim 1, wherein the corrosion inhibitor is 2-methyl-3-butyn-2-ol.

9. A cleaning composition of claim 1, wherein the corrosion inhibitor is selected from 8-hydroxyquinoline-2-carboxylic acid, 5-chloro-7-iodo-quinolin-8-ol, 5,7-dichloro-2-((dimethylamino)methyl)quinolin-8-ol, 8-hydroxyquinoline-4-carbaldehyde, 8-hydroxyquinoline-4-carbaldehyde-oxime, 8-hydroxyquinoline-5-sulfonic acid monohydrate.

10. A cleaning composition of claim 1, wherein the cleaning composition is a concentrate that contains less than 80 weight percent water.

11. A cleaning composition of claim 1, wherein the cleaning composition is a use composition that contains at least 10 weight percent water.

12. A cleaning composition of claim 1, further comprising a secondary cleaning compound selected from morpholine, L-cysteine, hydroxyl ethyl cellulose, polyvinylpyrrolidone, a polyamine, a glycol ether, and combinations thereof.

13. A cleaning composition of claim 1, further comprising a secondary corrosion inhibitor selected from oxalic acid, succinic acid, L-tartaric acid, and combinations thereof.

14. A cleaning composition of claim 1, further comprising one or more of chelating agent, oxidizer, surfactant, oxygen scavenger, solvent, polymer and buffer.

15. A method of cleaning a microelectronic device substrate, the method comprising:
providing cleaning composition
providing a microelectronic device substrate, and
contacting a surface of the microelectronic device substrate with the cleaning composition, wherein the cleaning composition comprises:
water,
base to provide a pH of at least 8,
a cleaning compound, and
a corrosion inhibitor selected from:
a guanidine functional compound selected from dicyandiamide, guanylurea, a guanidine salt, and glycocyamine,
2-methyl-3-butyn-2-ol,
a pyrazolone functional compound selected from 3-methyl-2-pyrazolin-5-one, 3-methyl-1-(4-sulfophenyl)-2-pyrazolin-5-one, and 3-methyl-1-p-tolyl-5-pyrazolone, and
a hydroxyquinoline compound selected from 8-hydroxyquinoline-2-carboxylic acid, 5-chloro-7-iodo-quinolin-8-ol, 5,7-dichloro-2-((dimethylamino)methyl)quinolin-8-ol, 8-hydroxyquinoline-4-carbaldehyde, 8-hydroxyquinoline-4-carbaldehyde-oxime, and 8-hydroxyquinoline-5-sulfonic acid monohydrate.

16. A method of claim 15 wherein the surface of the substrate includes residue, and the method is effective to remove at least 70 percent of the residue.

17. A method of claim 15 wherein the residue is selected from a post-CMP residue, a post-etch residue, and a post-ash residue.

18. A method of claim 15 wherein the surface includes exposed metal selected from: cobalt, copper, and both cobalt and copper.

19. A cleaning composition of claim 1 further comprising a complexing agent.

* * * * *